(12) United States Patent
Venkataramani et al.

(10) Patent No.: US 9,454,627 B1
(45) Date of Patent: Sep. 27, 2016

(54) SYSTEMS AND METHODS FOR OPTIMIZING EXECUTABLE MODELS FOR HARDWARE SYNTHESIS

(71) Applicant: The MathWorks, Inc., Natick, MA (US)

(72) Inventors: Girish Venkataramani, Boston, MA (US); Kiran K. Kintali, Ashland, MA (US); Wei Zang, Fremont, CA (US); Wang Chen, Brookline, MA (US)

(73) Assignee: The MathWorks, Inc., Natick, MA (US)

( * ) Notice: Subject to any disclaimer, the term of this patent is extended or adjusted under 35 U.S.C. 154(b) by 0 days.

(21) Appl. No.: 14/640,543

(22) Filed: Mar. 6, 2015

Related U.S. Application Data

(60) Provisional application No. 61/949,089, filed on Mar. 6, 2014.

(51) Int. Cl.
*G06F 17/50* (2006.01)

(52) U.S. Cl.
CPC ......... *G06F 17/505* (2013.01); *G06F 17/5022* (2013.01)

(58) Field of Classification Search
CPC .................. G06G 17/505; G06G 17/5022
USPC .................. 716/101–107, 132–134
See application file for complete search history.

(56) References Cited

U.S. PATENT DOCUMENTS

| | | | |
|---|---|---|---|
| 8,694,947 B1 | 4/2014 | Venkataramani et al. | |
| 8,745,557 B1 | 6/2014 | Venkataramani et al. | |
| 2007/0124716 A1* | 5/2007 | Nation | G06F 17/5045 716/102 |
| 2015/0379183 A1* | 12/2015 | Odabasi | G06F 17/5077 716/103 |

OTHER PUBLICATIONS

Raudvere, Tarvo, et al., "Application and Verification of Local Nonsemantic-Preserving Transformations in System Design," IEEE Transactions on Computer-Aided Design of Integrated Circuits and Systems, vol. 27, No. 6, Jun. 2008, pp. 1091-1103.

Raudvere, Tarvo, "System Level Techniques for Verification and Synchronization after Local Design Refinements," Stockholm, Royal Institute of Technology, Aug. 2007, pp. 1-169.

* cited by examiner

*Primary Examiner* — Paul Dinh
(74) *Attorney, Agent, or Firm* — Cesari and McKenna, LLP; Michael R. Reinemann

(57) ABSTRACT

Systems and methods optimize hardware description generated from a graphical model automatically. The system may include an optimizer. The optimizer may add a serializer component and a deserializer component to the model. The serializer component may receive parallel data and may produce serial data. The serializer may introduce one or more idle cycles into the serial data being produced. The deserializer component may receive serial data and may produce parallel data. The serializer and deserializer components may receive and generate control signals. The control signals may include a valid signal for indicating valid data elements of the serial and parallel data, and a start the start signal for indicating the beginning of a new frame or cycle when constructing parallel data from serial data.

30 Claims, 13 Drawing Sheets

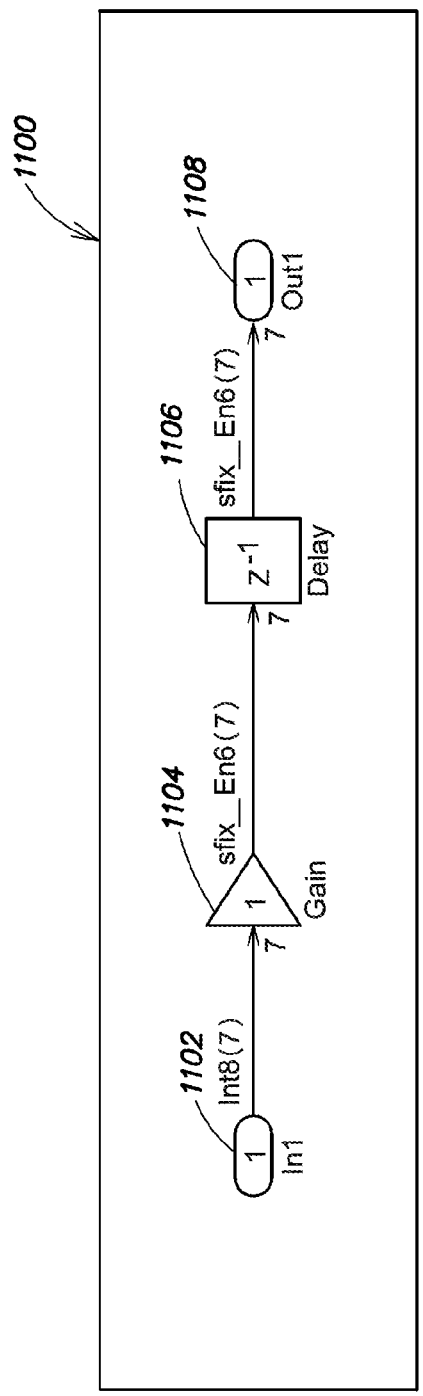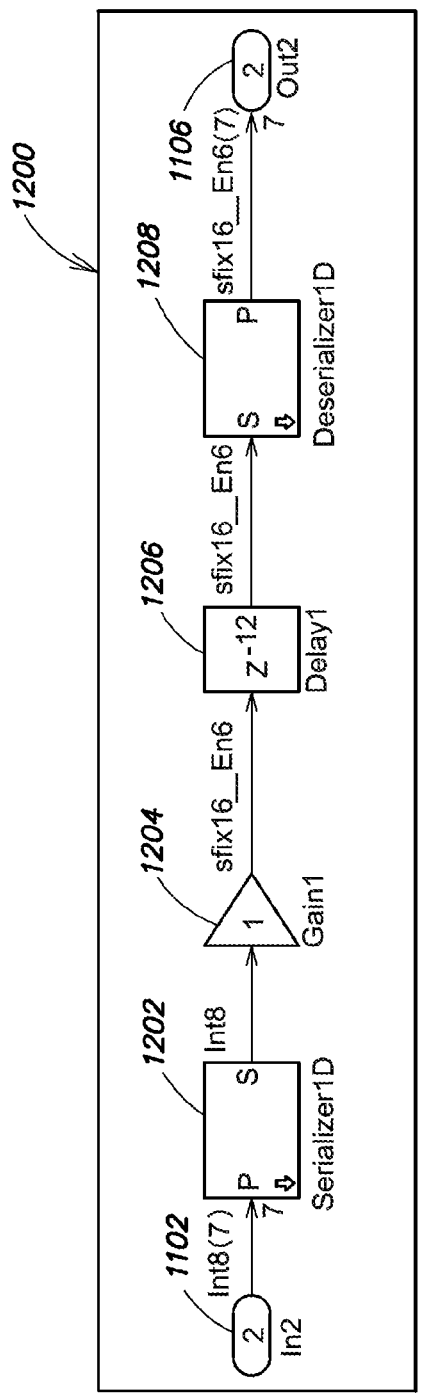
FIG. 11
FIG. 12

SYSTEMS AND METHODS FOR OPTIMIZING EXECUTABLE MODELS FOR HARDWARE SYNTHESIS

CROSS-REFERENCE TO RELATED APPLICATIONS

This application also claims the benefit of Provisional Patent Application Ser. No. 61/949,089, filed Mar. 6, 2014, by Girish Venkataramani et al. for a System and Method for Performing Sharing and Streaming Optimizations in Executable Models, which application is hereby incorporated by reference in its entirety.

BRIEF DESCRIPTION OF THE DRAWINGS

The invention description below refers to the accompanying drawings, of which:

FIG. 11 is a schematic illustration of a source model in accordance with an embodiment;

FIG. 12 is a schematic illustration of a first optimized model for the source model of FIG. 11 in accordance with an embodiment;

DETAILED DESCRIPTION OF ILLUSTRATIVE EMBODIMENTS

Figure 1:
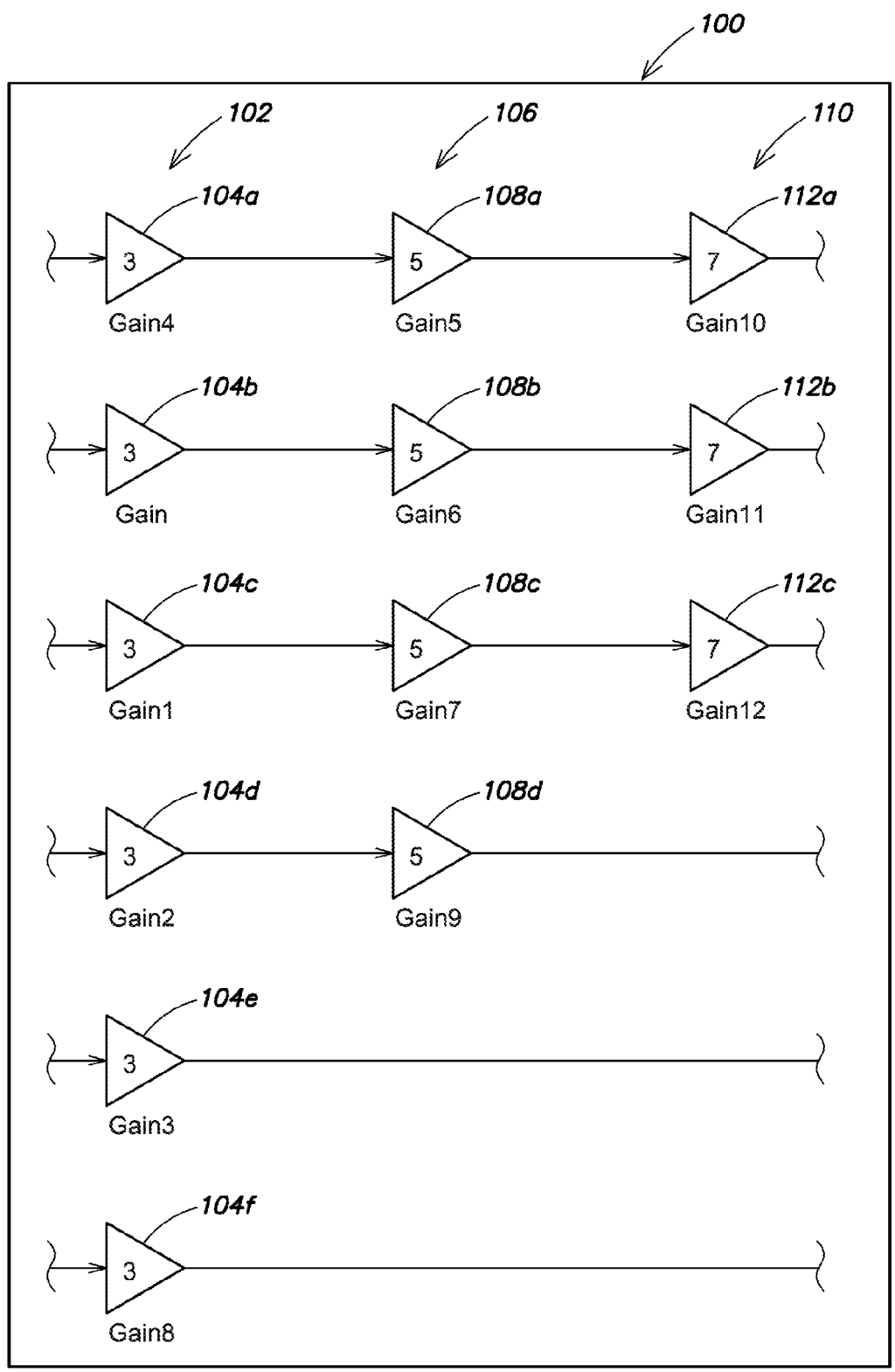
FIG. 1 is a schematic illustration of a graphical model in accordance with an embodiment.

Computer-based modeling environments are often used to design systems, such as control systems, communications systems, factory automation systems, etc. A user may construct a computer model of a system being developed within a modeling environment. Models may be defined primarily graphically or primarily textually. A graphical model may include a plurality of model elements such as blocks, icons, states, objects, etc., that have predetermined and/or custom defined functionality. Relationships may be established among model elements, and these relationships may appear visually in the model, for example, as arrows, wires, etc. The model may have executable semantics, and may be executed, e.g., simulated, by the modeling environment. For example, the modeling environment may generate executable instructions based on the graphically defined model. During execution, a model processes input values and generates output values.

A user may execute, e.g., run, a model using sample input data, and evaluate whether the model operates in the intended manner. For example, the user may determine whether the model, when executed, generates expected output values. If it does not, the user may revise the model. When the user is satisfied that the model accurately represents the operation of a system being designed, a code generator may generate code, such as computer source code, for the model. The code generator may be part of the modeling environment or it may be a separate, add-on tool. The generated code, which may be run outside of the modeling environment, may be loaded onto a target hardware platform and run. For example, the code may be compiled and executed by a microprocessor, a digital signal processor (DSP), or other processing logic of a physical, deployed system. In some embodiments, the generated code may be in the form of a hardware description language (HDL) and may be used to synthesize one or more programmable hardware elements, such as a Field Programmable Gate Array (FPGA), an Application Specific Integrated Circuit (ASIC), a Complex Programmable Logic Device (CPLD), a System on a Chip (SoC), etc. The target hardware element may represent a production device, and may be a deployed in a real-world environment, such as a factory floor, a communication device, etc.

Modeling environments may support the creation of models of different domains, such as dynamic or time-based models, state-based models, event-based models, and data/control flow models, among others. A dynamic model changes over time. For example, time-based relationships may be defined between signals and state variables of a dynamic model, and the solution of the model may be obtained by evaluating these relationships over a time, e.g., the model's simulation time. The model may be solved repeatedly over the simulation time at intervals called time steps. The modeling environment may specify a default simulation time, for example from zero to ten seconds, although the simulation time, including the units of time, may be altered by a user. Simulation time differs from actual clock time. For example, even though a model's execution may be simulated from zero to ten seconds, it may take a small fraction of actual clock time to execute the model over that simulation time.

Groups of model elements may be organized and saved as components, for example for reuse at other locations in the same model or in other models. A component may be visually represented as a single icon in a model. Exemplary components include subsystems and sub-models of the Simulink model-based design environment, Virtual Instruments (VIs) of the LabVIEW programming system, and SuperBlocks of the MatrixX modeling environment. A component may also include one or more other components, establishing hierarchal levels through the model. Model elements and components may be linked by connections to exchange information, such as data, control, signals, events, and messages. The connections may establish information paths through the model, which may extend from the model's top-level inputs to its top-level outputs.

The modeling environment may create an in-memory representation of the executable model, such as an intermediate representation. The intermediate representation may include nodes that represent model elements and edges that represent model connections.

The code generator may apply one or more optimizations to the intermediate representation so as to produce HDL code that is optimized for area, power, and/or speed. For example, a streaming optimizer may evaluate the intermediate representation of the model, and transform one or more vector data paths to a scalar data path or to several smaller-sized vector data paths for an area-optimized implementation. The streaming optimizer may also configure the transformed data paths to operate at a faster rate than the rate that would otherwise be used without the streaming transformation. For example, the data paths may be oversampled. The degree to which data paths are converted by the streaming optimizer may be specified through a user-settable parameter called a streaming factor. A resource sharing optimizer may search the intermediate representation for a set of nodes that implement equivalent functionality. The resource sharing optimizer may then modify the intermediate representation by replacing some or all of the equivalent nodes with a single shared node. The degree to which resources are shared by the resource sharing optimizer may be specified through a user-settable parameter called a resource sharing factor.

Both the streaming and resource sharing optimizers may insert new nodes into the intermediate representation. For example, they may insert Serializer and Deserializer nodes into the intermediate representation. A Serializer node may convert a parallel data stream at a first rate to a scalar data stream at a second rate that is faster than the first rate, while a Deserializer node may convert a scalar data stream at a first rate to a parallel data stream at a second rate that is slower than the first rate. Other nodes that may be inserted by the optimizers include Multiplexer (Mux) and Demultiplexer (Demux) nodes.

The one or more optimizations may result in the introduction of latencies or delays in one or more edges of the intermediate representation. If a latency or delay is introduced in a first edge, and this first edge merges with a second edge for which no (or a different) delay was introduced, then the information, such as signals, control, or data, represented by these two edges may no longer be aligned time-wise with each other. Such a mismatch or misalignment may result in incorrect results being computed during execution of the model or of the code generated from the model. A delay balancing engine may evaluate the intermediate representation, identify the introduced latencies or delays, and insert matching latencies or delays to keep the edges, and thus the model's paths, aligned.

FIG. 1 is a schematic illustration of a model 100 including a plurality of model elements, such as Gain blocks. Specifically, the model 100 may include a first set 102 of six Gain blocks 104a-f having a gain factor of three, a second set 106 of four Gain blocks 108a-d having a gain factor of five, and a third set 110 of three Gain blocks 112a-c having a gain factor of seven. Suppose a sharing factor of six is specified for the model 100. With the sharing factor set to six, a user may expect a net overclocking/oversampling for an HDL implementation of the model 100 to be six, and the user's expectation regarding the overclocking/oversampling may be based on a desired clock speed of a hardware implementation of the model 100. In response, the resource sharing optimizer may replace the six Gain blocks 104a-f from the first set 102 with a single shared Gain block having a gain factor of three. However, because the second set 106 includes four Gain blocks 108a-d and the third set 110 includes three Gain blocks 112a-c, which are less than the specified sharing factor, i.e., six, the resource sharing optimizer may be unable to replace either of these two sets 106 and 110 of Gain blocks with a shared resource. For example, replacing the first set 102 with a single shared resource may result in an overclocking multiple of six, while replacing the second set 106 with a single shared resource may result in an overclocking multiple of four and replacing the third set 110 with a single shared resource may result in an overclocking multiple of three. To support such disparate rate domains, Serializer and Deserializer components operating at a base rate that is the least common multiple (LCM), i.e., 12, may need to be utilized for all three sets 102, 106, and 110. This base rate, however, is double the overclocking/oversampling expected by the user when selecting a sharing factor of six, and may thus not conform to the user's intended hardware implementation. To maintain an overclocking/oversampling multiple of six, a resource shared version of the model 100 may thus include a total of eight Gain blocks (one shared Gain block in place of the first set 102, the four original Gain blocks of the second set 106, and the three original Gain blocks of the third set 110, and have an overclocking or oversampling rate that is six times the sample rate of the original model 100.

An embodiment of the present disclosure extends the hardware optimizations that may be performed on a model. For example, an optimizer such as a resource sharing optimizer may introduce one or more idle cycles in the portion of the intermediate representation being transformed to permit additional sharing of resources without further increasing the overclocking/oversampling, for example without having to go to an LCM base rate. Referring to FIG. 1, the four original Gain blocks of the second set 106 may be replaced with a single shared Gain block, and two idle cycles may be introduced. The three original Gain blocks of the third set 110 may be replaced with a single shared Gain block, and three idle cycles may be introduced. The resource sharing optimizer may also remove the idle cycles downstream of the shared block. In some embodiments, idle cycles may be introduced through a new design of a Serializer node, and removed through a new design of a Deserializer node. In addition, the new Serializer and Deserializer nodes for all three sets 102, 106, and 110 may operate at an overclocking/oversampling multiple of six. Accordingly, the user's expectation when selecting a sharing factor may be maintained. The resource groups having fewer resources than the specified sharing factor, such as the second and third sets 106 and 110, may be padded with Idle Cycles.

In some embodiments, a user may select an auto mode that minimizes the overclocking/oversampling when performing resource sharing and/or streaming optimizations, while maximizing the resource sharing and streaming optimizations. The optimization engine 308 may analyze the model and find all groups of shareable resources. The optimization engine 308 may then determine the size of all of the groups of shareable resources, e.g., SIZE (groups), and the maximum size of the groups, e.g., MAX (Size (groups)), and may utilize that value as the sharing factor. The optimization engine 308 may analyze the model and find instances where a parallel data stream is to be converted to a serial data stream, and determine for example MAX (the vector size of the input data signal over the scalar or smaller vector size of the output data signal for all such instances). The optimization engine 308 may utilize that value as the streaming factor.

The model may represent a synchronous system. The optimizer may maintain the synchronous operation of the model (and thus of HDL generated for the model) through the addition of Idle Cycles implemented, for example through the new Serializer and Deserializer components. The addition of Idle Cycles thus constrains the overclocking/oversampling to the streaming and/or sharing factors, while maintaining synchronous operation of the model.

In some embodiments, the new Serializer and Deserializer nodes may also receive and generate new control signals. The control signals also may be used to implement a synchronous hardware implementation of a model that also constrains the overclocking/oversampling. The control signals may include a Valid signal that may be used to control execution of a component of a model. For example, the control signal may direct the component to execute when valid data is available, and suspend execution when the data is not valid or when valid data is unavailable.

Modeling Environment

Figure 2:
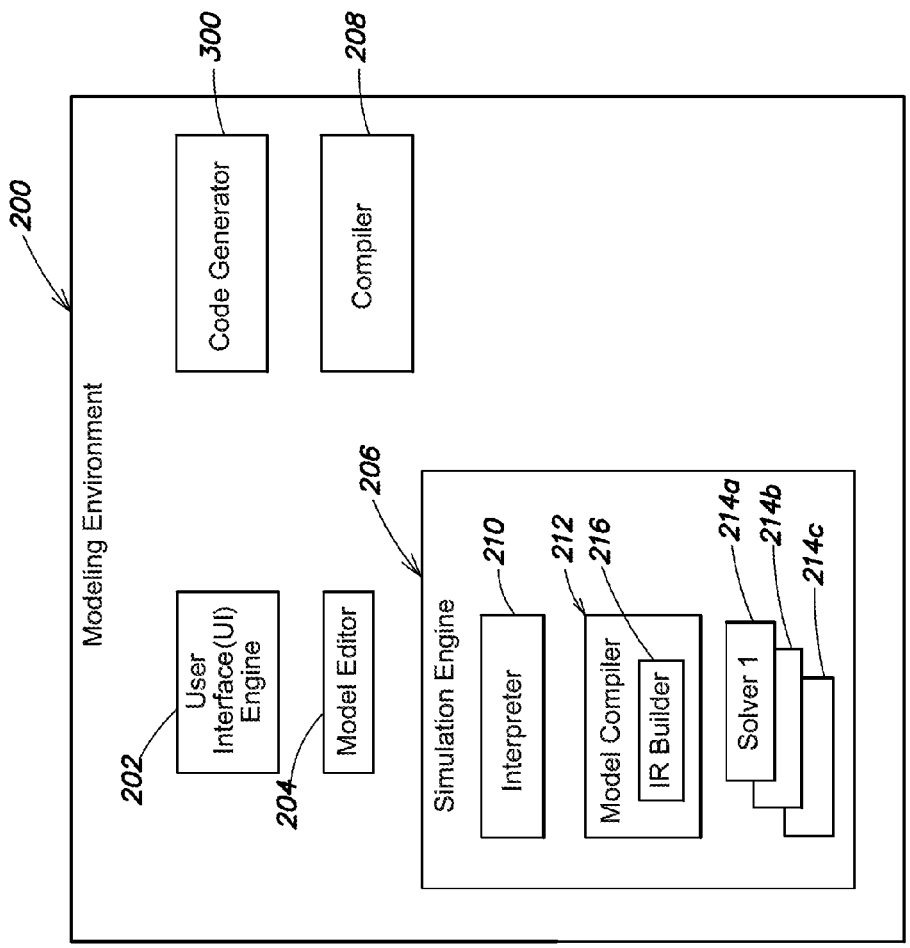
FIG. 2 is a schematic illustration of a modeling environment in accordance with an embodiment.

FIG. 2 is a schematic illustration of a modeling environment 200 in accordance with an embodiment. The modeling environment 200 may include a User Interface (UI) engine 202, a model editor 204, a simulation engine 206, a code generator 300, and a compiler 208. The UI engine 202 may create and present one or more User Interfaces (UIs), such as Graphical User Interfaces (GUIs) and/or Command Line Interfaces (CLIs), on a display of a workstation or other data processing device. The UIs may be operated by a user to initiate various model-related tasks, such as opening, constructing, and saving models, and the model editor 204 may perform selected operations on a model in response to user inputs.

The simulation engine 206 may include an interpreter 210, a model compiler 212, and one or more solvers, such as solvers 214a-c. The model compiler 212 may include one or more Intermediate Representation (IR) builders, such as IR builder 216. The simulation engine 206 may execute, e.g., compile and run or interpret a model using one or more of the solvers 214a-c. Exemplary solvers include one or more fixed-step continuous solvers, which may utilize integration techniques based on Euler's Method or Heun's Method, and one or more variable-step solvers, which may be based on the Runge-Kutta and Dormand-Prince pair.

The code generator 300 may generate code for a model or portion thereof automatically. The generated code may be in the form of Hardware Description Language (HDL) code for use in synthesizing one or more target hardware elements. In some embodiments, the generated code may be source code or object code suitable for execution outside of the modeling environment 200, and may be referred to as standalone code. To the extent the generated code is source code, the compiler 208 may compile the source code into object code for execution by a target computer platform. The generated source code may conform to selected programming language, such as the C or C++ programming languages.

Suitable modeling environments include the MATLAB® programming system and the SIMULINK® model-based design system from The MathWorks, Inc. of Natick, Mass., the LabVIEW programming system from National Instruments Corp. of Austin, Tex., the MatrixX modeling environment from National Instruments Corp., the Visual Engineering Environment (VEE) from Agilent Technologies, Inc. of Santa Clara, Calif., a Unified Modeling Language (UML) system, a Systems Modeling Language (SysML) system, and System Generator from Xilinx, Inc., among others. Those skilled in the art will A model may be a graphical, textual, or combination graphical/textual model. Suitable models include Simulink models, Stateflow charts, LabVIEW block diagrams, MatrixX models, and Agilent VEE diagrams.

Figure 3:
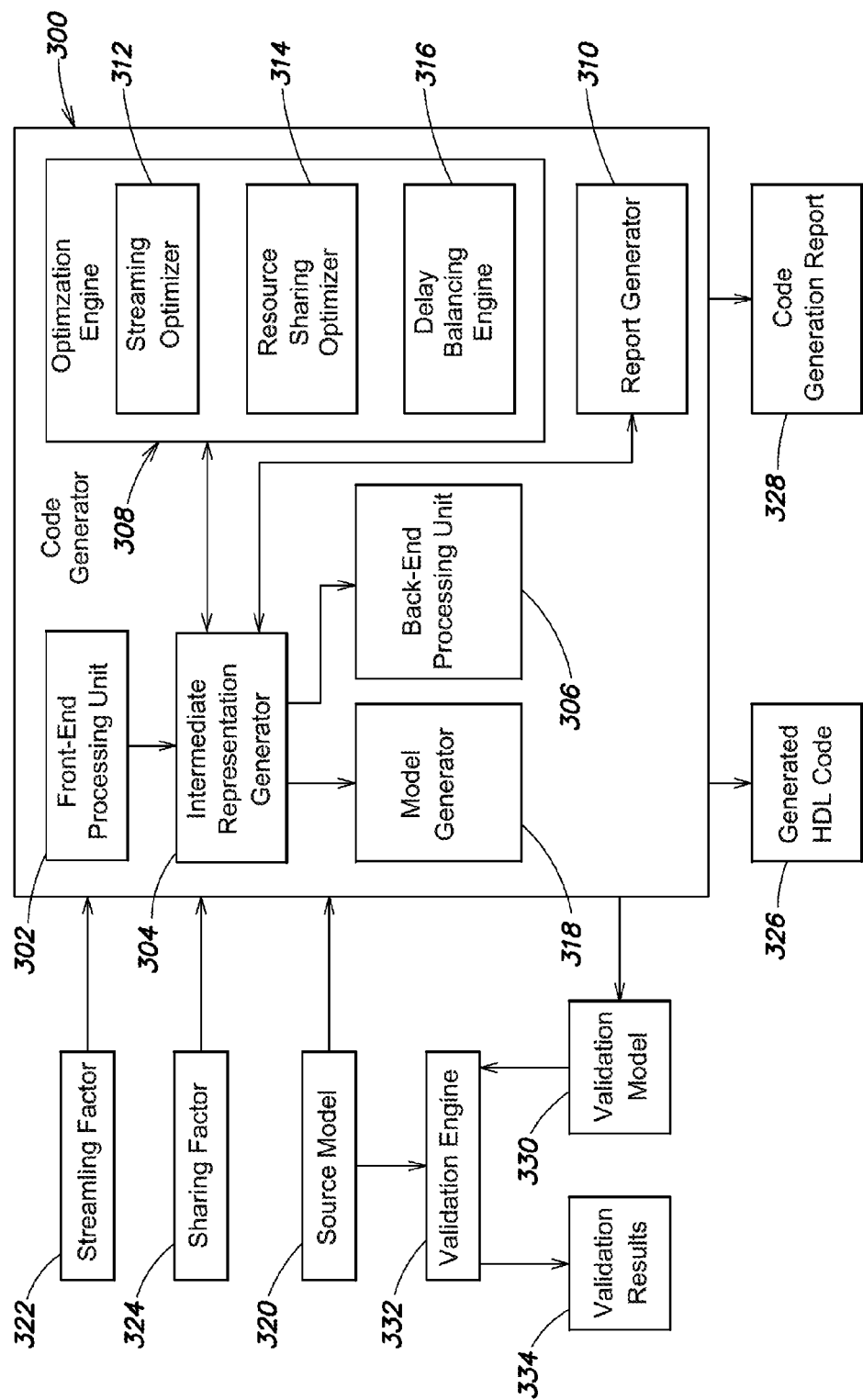
FIG. 3 is a schematic illustration of a code generator in accordance with an embodiment.

FIG. 3 is a schematic illustration of the code generator 300 in accordance with an embodiment. The code generator 300 may include a front-end processing unit 302, an intermediate representation (IR) generator 304, a back-end processing unit 306, an optimization engine 308, and a report generator 310. The optimization engine 308 may include a streaming optimizer 312, a resource sharing optimizer 314, and a delay balancing engine 316. In some embodiments, the code generator 300 also may include a model generator 318.

It should be understood that the code generator 300 may rely on the IR builder 216 of the model compiler 212 to construct the in-memory representations, rather than having its own IR generator 304.

The code generator 300 may access a source model 320. Depending on the optimizations to be performed, the code generator 300 also may receive a streaming factor 322 and a sharing factor 324. The code generator 300 may generate HDL code 326 corresponding to the source model 320 where the generated HDL code 326 is optimized for hardware implementation. The generated HDL code 326 may be bit true and cycle accurate (modulo a well-defined initial latency) to the source model 320. Exemplary HDL code that may be generated includes VHDL code, Verilog code, SystemC code, and vendor or target specific HDL code, such as Xilinx FPGA libraries. In some embodiments, the code generator 300 may generate embedded MATLAB code. The report generator 310 may produce one or more code generation reports 328, such as a hardware resource utilization report or a timing diagram.

The model generator 318 may produce a validation model 330 that corresponds to the optimized HDL code 326. The source model 320 and the validation model 330 may be received by a validation engine 332, which may be part of the modeling environment 200. The validation engine 332 may compare the source model 320 to the validation model 330, and may generate validation results 334. A user may evaluate the validation results to determine whether the behavior of the validation model 330 (and therefore the behavior of the optimized HDL code 326) is equivalent to the behavior of the source model 320.

The code generator 300 and/or its one or more of its parts may comprise registers and combinational logic configured and arranged to produce sequential logic circuits. In some embodiments, the code generator 300 may be implemented through one or more software modules or libraries containing program instructions pertaining to the methods described herein, that may be stored in memory and/or on computer readable media, and may be executed by one or more processors. Other computer readable media may also be used to store and execute these program instructions. In alternative embodiments, various combinations of software and hardware, including firmware, may be utilized to implement the present invention.

The generated HDL code 326 may be output in the form of a build or other file, and may be stored in memory. The code generation report 328 also may be in the form of a file, and may be presented on an output device, such as a display or a printer.

Figure 4:
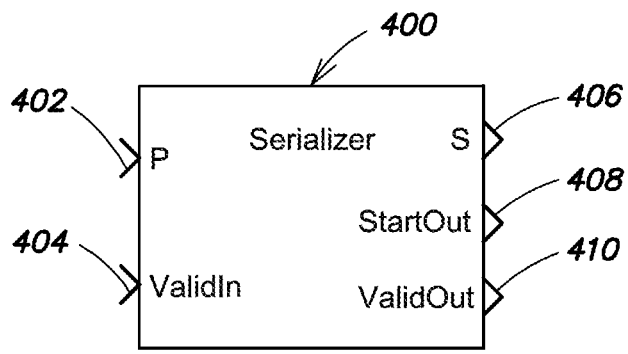
FIG. 4 is a schematic illustration of a serializer component in accordance with an embodiment.

FIG. 4 is a schematic illustration of a Serializer component 400 in accordance with an embodiment. The Serializer component 400 may include one or more input ports, such as a first input port (P) 402 and a second input port (ValidIn) 404. The Serializer component 400 also may include one or more output ports, such as a first output port (S) 406, a second output port (StartOut) 408, and a third output port (ValidOut) 410. The Serializer component 400 may convert a slower vector data signal received at the first input port (P) 402 into a faster stream of scalar output signals or smaller size vector output signals on the first output port (S) 406. The Serializer component 400 also may introduce one or more idle cycles into the output data signal on the first output port (S) 406. The slower vector of the input data signal may be converted to a faster signal based on the values of one or more parameters, such as a Ratio parameter. The Ratio parameter may specify the vector size of the input data signal over the vector size of the output data signal. An Idle Cycles parameter may also be specified for a Serializer component 400. The value of the Idle Cycles parameter may indicate the number of idle cycles to be added to each frame or cycle of the output data signal. In some embodiments, the Ratio and Idle Cycles parameters for a given Serializer component of a model may be user-specified, for example through a graphical affordance, such as a dialog, or the Ratio and Idle Cycles parameters may be determined programmatically, as described further herein.

The Serializer component may introduce the one or more idle cycles starting at a predetermined location, such as starting at the end of a frame, starting at a beginning of a frame, etc. In some embodiments, an Idle Cycles parameter may be an array, and the values of the array indicate the locations in the frame at which the one or more idle cycles may be introduced. The locations, moreover, may be non-contiguous. For example, an Idle Cycle parameter of [0 0 0 0 1 1 1 0 0 1 1 0 0] may indicate that the Serializer component is to introduce an idle cycle at the fifth, sixth, seventh, tenth, and eleventh serial data locations of the frame. The other locations may have serial data elements. The Serializer component 400 also may change the sample time to match the faster, serialized output. For example, the rate transition between the input and output data signals performed by the Serializer component 400 may be 1/(Ratio+Idle Cycles). The serialization process performed by the Serializer component 400 may depend on a valid Boolean signal, e.g., True, received on the second input port (ValidIn) 404. A value of True indicates that the input signal data to the Serializer component 400 is valid. Additionally, the Serialization component 400 may also output a first Boolean output signal, e.g., True or False, on the second output port (StartOut) 408 to indicate when to start deserialization, and a second Boolean output signal, e.g., True or False, on the third output port (ValidOut) 410 on the first output port (S) to indicate when the output data is valid.

In some embodiments, the Ratio and Idle Cycle parameters of a Serializer component 400 may be user specified, for example through a dialog or other user interface. In some embodiments, the Ratio and Idle Cycle parameters may be programmatically determined.

Figure 5:
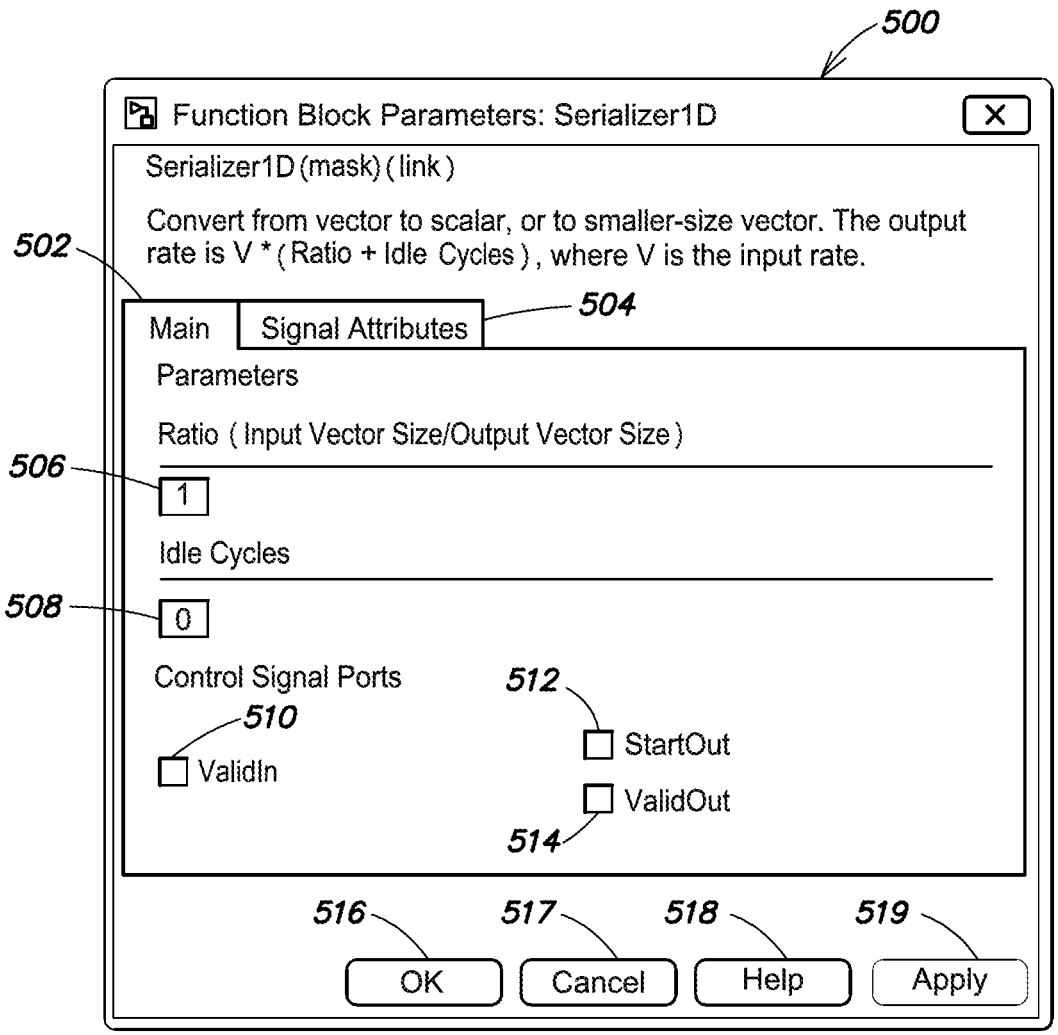
FIG. 5 is a schematic illustration of a user interface element in accordance with an embodiment.

FIG. 5 is a schematic illustration of a graphical affordance, such as a dialog, 500 that may be associated with a Serializer component 400 in accordance with an embodiment. The dialog 500 may include one or more tabbed areas having window elements (widgets) for receiving values of parameters for the Serializer component 400. For example, the dialog 500 may include a first tab (Main) 502 and a second tab (Signal Attributes) 504. The first tab 502 may include a first data entry box 506 for receiving a value for a Ratio parameter, and a second data entry box 508 for receiving a value for an Idle Cycles parameter. In addition, the first tab 502 may include one or more checkboxes to designate whether the Serializer component 400 should include corresponding control signal ports. For example, the first tab 502 may include a first checkbox 510 to indicate whether the Serializer component 400 should include the second input port (ValidIn) 404, a second checkbox 512 to indicate whether the Serializer component 400 should include the second output port (StartOut) 408, and a third checkbox 514 to indicate whether the Serializer component 400 should include the third output port (ValidOut) 410.

The second tab (Signal Attributes) 504 may have one or more widgets (not shown) for specifying attributes of the input signal to the Serializer component 400, such as the size of the input data signal, e.g., data dimension, and the sample time of the Serializer component 400. The dialog 500 may also include OK, Cancel, Help, and Apply command buttons 516-519 whose operation is well understood.

Figure 6:
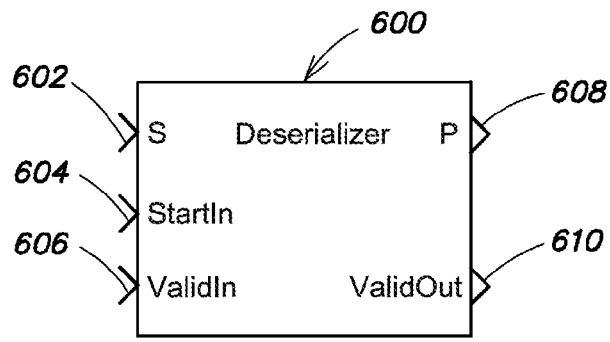
FIG. 6 is a schematic illustration of a deserializer component in accordance with an embodiment.

FIG. 6 is a schematic illustration of a Deserializer component 600 in accordance with an embodiment. The Deserializer component 600 may include one or more input ports, such as a first input port (S) 602, a second input port (StartIn) 604, and a third input port (ValidIn) 606. The Deserializer component 600 also may include one or more output ports, such as a first output port (P) 608 and a second output port (ValidOut) 610. The Deserializer component 600 may buffer a faster, scalar stream or vector signal into a larger, slower vector output signal. The faster input signal may be converted to a slower output signal based on the values of one or more parameters, such as a Ratio parameter. The Ratio parameter may specify the vector size of the output data signal over the vector size of the input data signal. An Idle Cycles parameter may also be specified for a Deserializer component 600. The value of the Idle Cycles parameter may indicate the number of idle cycles to be removed from, e.g., the end of each frame of, the input data signal received at the first input port (S) 602, for example by a Serializer component 400.

The conversion performed by the Deserializer component 600 may change the sample time of the output signal at the first output port (P) 608. For example, the rate transition between the input and output data signals performed by the Deserializer component 600 may be (Ratio+Idle Cycles)/1. Also, the Deserializer component 600 may delay the output signal one slow signal frame, for example to collect serialized data before it can be output as a vector.

In some embodiments, the Ratio and Idle Cycle parameters of a Deserializer component 600 may be user specified, for example through a dialog or other user interface. In some embodiments, the Ratio and Idle Cycle parameters may be programmatically determined. The Deserializer may be configured to remove the one or more idle cycles at the same locations of a frame at which the Serializer is configured to introduce the one or more idle cycles.

Figure 7:
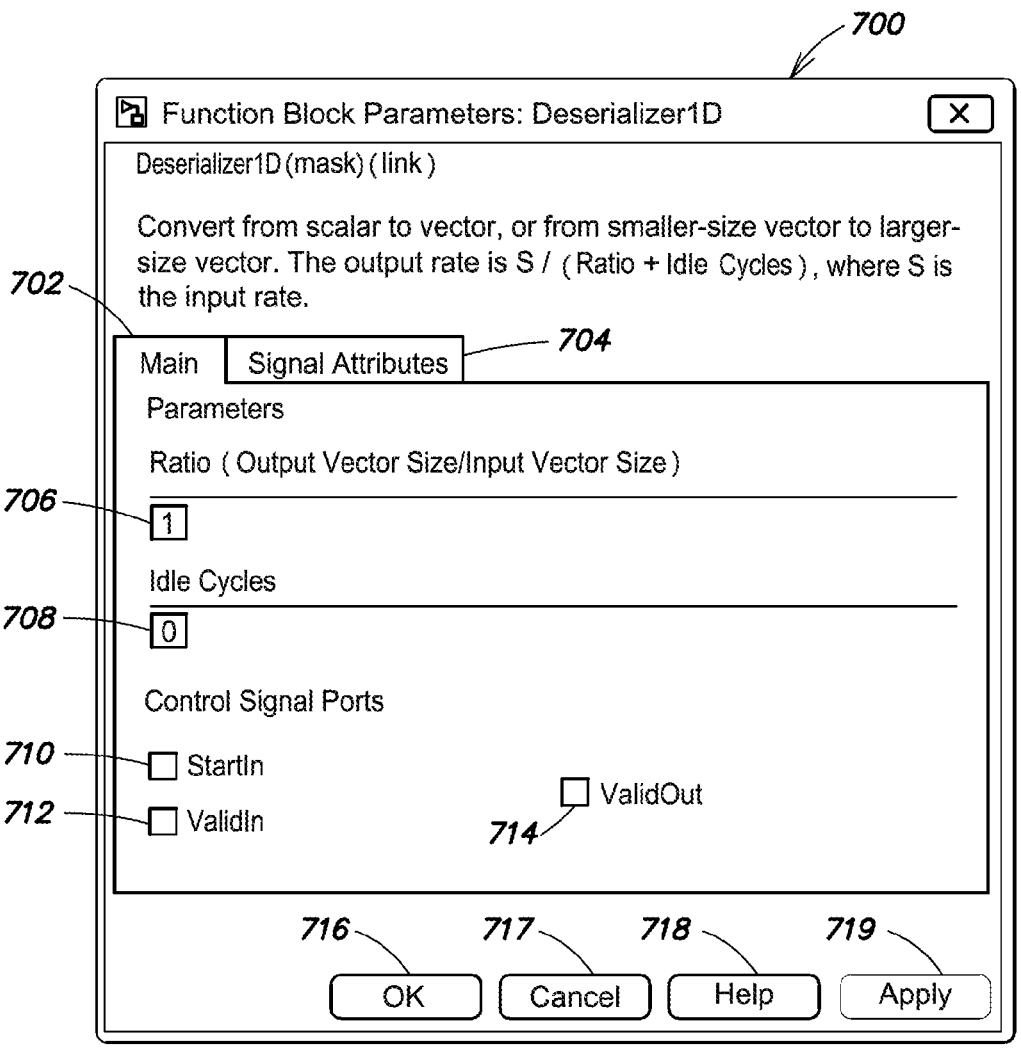
FIG. 7 is a schematic illustration of a user interface element in accordance with an embodiment.

FIG. 7 is a schematic illustration of a dialog 700 that may be associated with a Deserializer component 600 in accordance with an embodiment. The dialog 700 may include one or more tabbed areas having window elements (widgets) for receiving values of parameters for the Deserializer component 600. For example, the dialog 700 may include a first tab (Main) 702 and a second tab (Signal Attributes) 704. The first tab 702 may include a first data entry box 706 for receiving a value for a Ratio parameter, and a second data entry box 708 for receiving a value for an Idles Cycles parameter. In addition, the first tab 702 may include one or more checkboxes to designate whether the Deserializer component 600 should include corresponding control signal ports. For example, the first tab 702 may include a first checkbox 710 to indicate whether the Deserializer component 600 should include the second input port (StartIn) 604, a second checkbox 712 to indicate whether the Deserializer component 600 should include the third input port (ValidIn)

606, and a third checkbox 714 to indicate whether the Deserializer component 600 should include the second output port (ValidOut) 610.

The second tab (Signal Attributes) 704 may have widgets (not shown) for specifying attributes of the input signal to the Deserializer component 600, such as the size of the input data signal, e.g., data dimension, and the sample time of the Deserializer component 600. The dialog 700 may also include OK, Cancel, Help, and Apply command buttons 716-719 whose operation is well understood.

Figure 8:
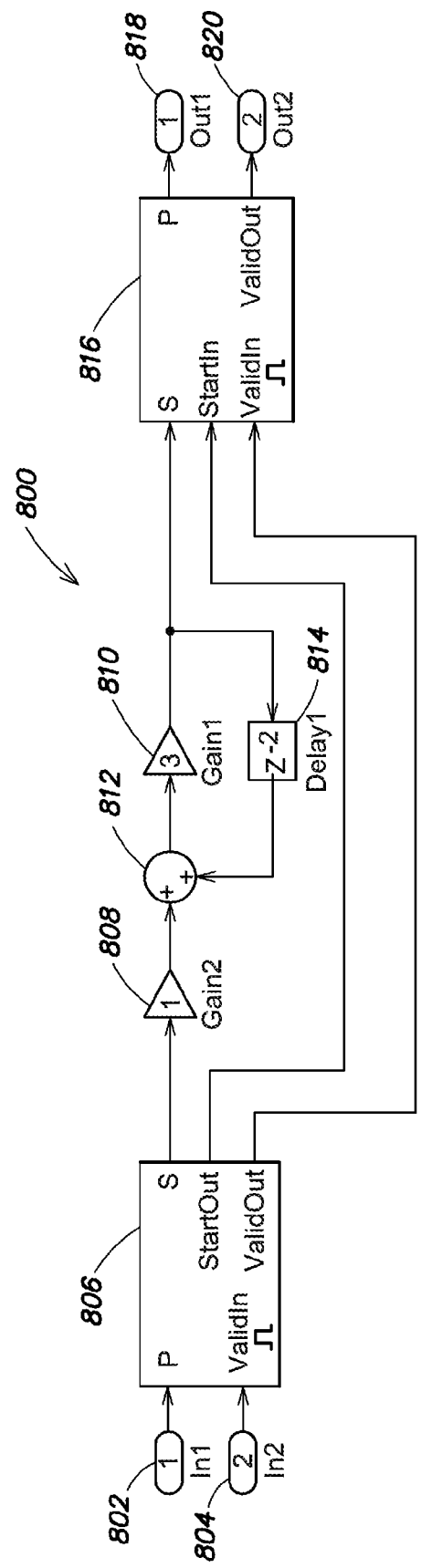
FIG. 8 is a schematic illustration of a graphical model in accordance with an embodiment.

FIG. 8 is a schematic illustration of a graphical model 800 in accordance with an embodiment. The model 800 includes first and second inport blocks 802 and 804, a Serializer block 806, first and second Gain blocks 808 and 810, a Sum block 812, a Delay block 814, a Deserializer block 816, and first and second outport blocks 818 and 820. The first inport block 802 is connected to a data input port of the Serializer block 806, and the second inport block 804 is connected to a control input port (ValidIn) of the Serializer block 806. The data output of the Serializer block 806 is processed by the first and second Gain blocks 808 and 810, the Sum block 812, and the Delay block 814, and received at a data input port of the Deserializer block 816. First and second control signals (StartOut and ValidOut) are provided to control input ports (StartIn and ValidIn) of the Deserializer block 816. A data output port of the Deserializer block 816 is connected to the first outport block 818, and a control output port (ValidOut) of the Deserializer block 816 is connected to the second outport block 820.

Suppose the Serializer block 806 and the Deserializer block 816 are configured with Ratio parameters of 4 and Idle Cycle parameters of one.

Synchronous Operation—Idle Cycles

Figure 9:
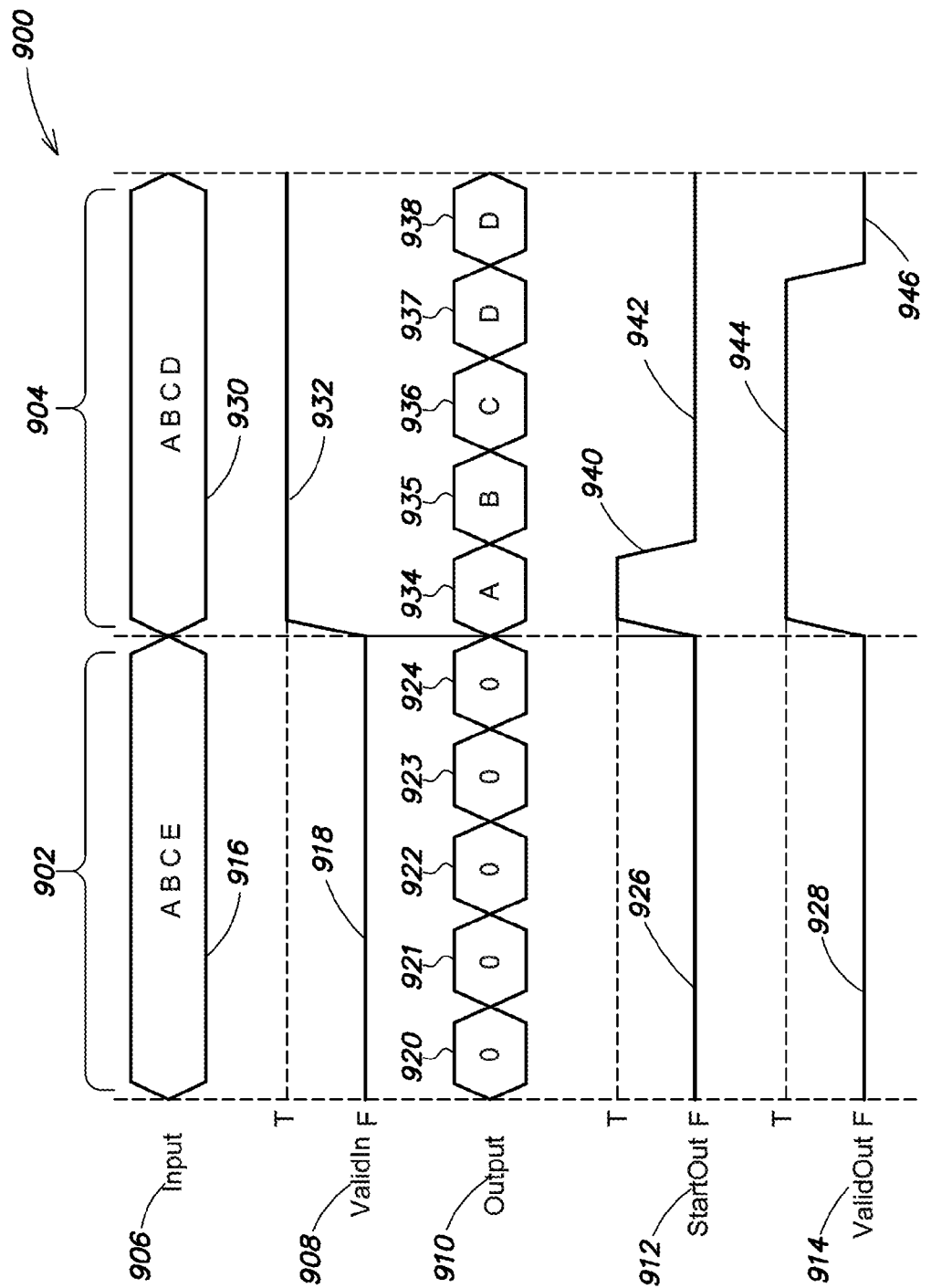
FIG. 9 is a schematic illustration of a timing diagram for a serializer component in accordance with an embodiment.

FIG. 9 is a schematic illustration of a timing diagram 900 illustrating an operation of the Serializer block 806 in accordance with an embodiment. The timing diagram 900 includes a first frame 902 and a second frame 904. For each frame 902 and 904, the timing diagram 900 includes a data input signal 906 and a ValidIn control input 908 that are received by the Serializer block 806, as well as a data output signal 910, a StartOut control signal 912, and a ValidOut control signal 914 that are output by the Serializer block 806. In the first frame 902, the Serializer block 806 receives parallel input data 'ABCE' 916. The Serializer block 806 also receives a ValidIn control signal of False 918. Because the ValidIn control signal 918 received by the Serializer block 806 is False for the entire first frame 902, the serial output data 920-924 produced by the Serializer block 806 for the parallel input data 916 may be set to null, e.g., zero, for the first frame 902. It should be understood that other values besides zero may be selected and utilized as null values. Furthermore, while the parallel input data 916 has four elements, e.g., 'ABCE', the serial output data 920-924 produced by the Serializer block 806 may have five elements, because the Idle Cycle parameter is set to one, causing the Serializer block 806 to introduce one idle cycle into the serial data 920-924. The Serializer block 806 may also output False signals 926 and 928 on its StartOut and ValidOut control signals for the first frame 902.

In the second frame 904, the Serializer block 806 receives parallel input data 'ABCD' 930, and a ValidIn control signal of True 932. Accordingly, the Serializer block 806 may convert the received parallel data 'ABCD' to serial data based on the Ratio parameter. For example, the Serializer block 806 converts the parallel data 'ABCD' 930 to serial data 'A', 'B', 'C', and 'D' 934-937 on its output. Again, the Serializer block 806 may introduce one extra serial data element 938 in response to the Idle Cycle parameter being set to one. In an embodiment, the Serializer block 806 may reuse the last data value, e.g., 'D', as the data element of the idle cycle 938. The Serializer block 806 may also set the StartOut control to True 940 for the serial data element 'A' 934 to indicate that this data element is the start of a frame, e.g., the second frame 904. For the other serial data elements 935-936, the Serializer block 806 may set the StartOut control to False 942. The Serializer block 806 may also set the ValidOut control signal to True 944 for the first four serial data elements 934-937, and to False 946 for the last serial data element 938 to indicate that the last serial data element 938 is an Idle Cycle, and is thus not valid data.

Figure 10:
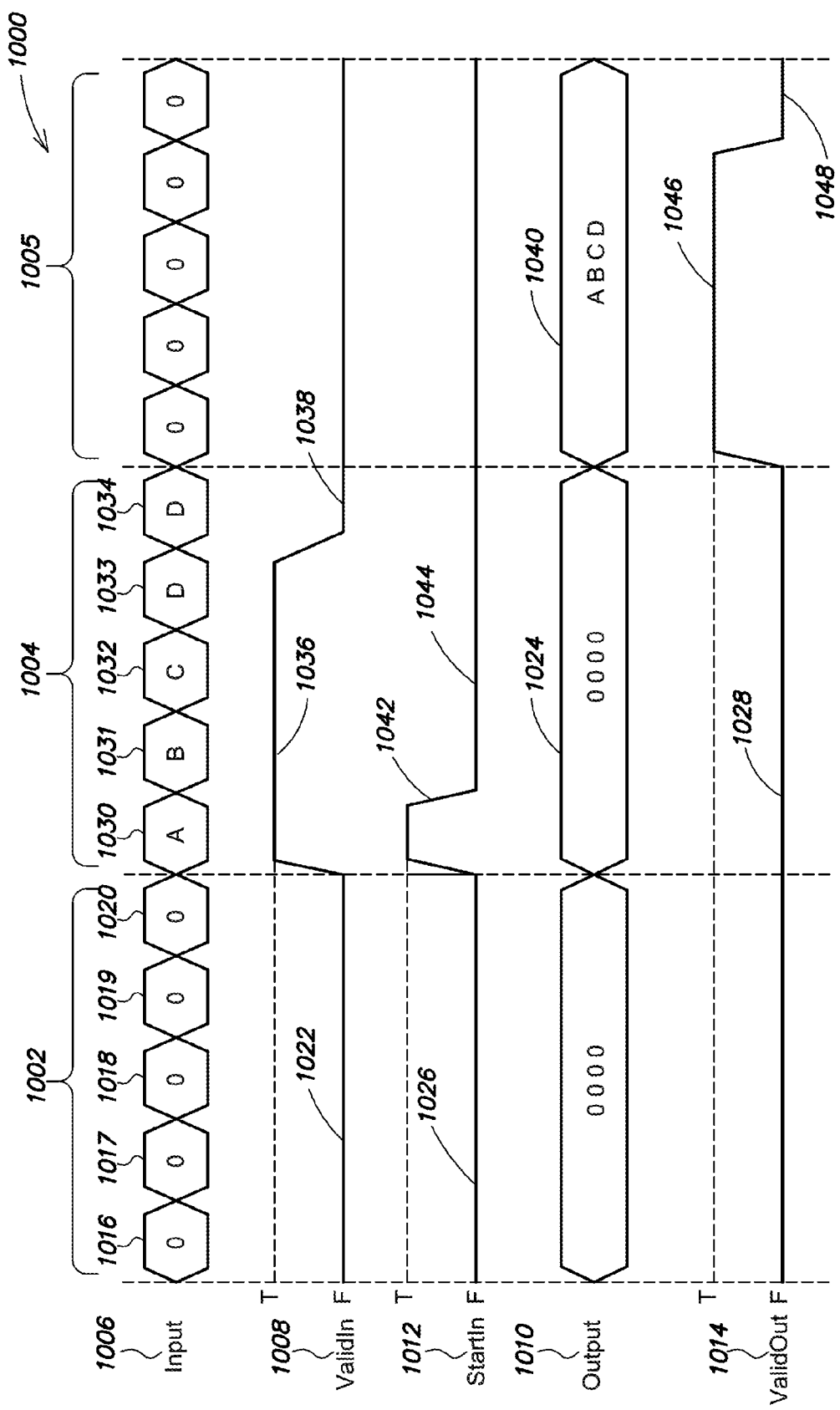
FIG. 10 is a schematic illustration of a timing diagram for a deserializer component in accordance with an embodiment.

FIG. 10 is a schematic illustration of a timing diagram 1000 illustrating an operation of the Deserializer block 816 in accordance with an embodiment. The timing diagram 1000 includes a first frame 1002, a second frame 1004, and a third frame 1005. For each frame 1002, 1004, and 1005, the timing diagram 100 includes a data input signal 1006, a ValidIn control signal 1008, and a StartIn control signal 1012 that are received by the Deserializer block 816, as well as a data output signal 1010 and a ValidOut control signal 1014 that are output by the Deserializer block 816. The serial input data received by the Deserializer block 816 in a first frame is output as parallel output data by the Deserializer block 816 in the next frame.

In the first frame 1002, the Deserializer 816 receives serial input data elements '0 0 0 0 0' 1016-1020. The serial input data 1016-1020 received by the Deserializer block 816 in the first frame 1002 is output by the Deserializer block 816 as parallel data 1024 in the second frame 1004. Because the ValidIn control signal 1022 received by the Deserializer block 816 is False for the entire first frame 1002, all of the elements of the parallel data 1024 produced by the Deserializer block 816 in the second frame 1004 may be set to null, e.g., zero. Furthermore, while the serial input data 1016-1020 received in the first frame 1002 has five elements, e.g., '0 0 0 0 0', the parallel output data 1024 produced by the Deserializer block 816 in the second frame 1004 has four elements, because the Idle Cycle parameter is set to one, causing the Deserializer block 816 to remove one idle cycle from the input serial data 1016-1020. In some embodiments, the Deserializer block 816 may remove the last serial data element 1020. The Deserializer block 816 may also receive a False signal 1026 for the StartIn control signal in the first frame 1002, and may output a False signal 1028 as its ValidOut control signal in the second frame 1004.

In the second frame 1004, the Deserializer block 816 receives five serial data elements 'A B C D D' 1030-1034, and a ValidIn control signal that is True 1036 for the first four serial data elements, and False 1038 for the fifth serial data element. The Deserializer block 816 may convert the serial input data elements 1030-3034 received in the second frame 1004 to a parallel output data element 1040 produced in the third frame 1005. The Deserializer block 816 also receives a StartIn control signal in the second frame 1004 that is True 1042 for the first serial data element, and False 1044 for the second through fifth serial data elements. Accordingly, the Deserializer block 816 may start the parallel data 1040 produced in the third frame 1005 with the first serial data element, i.e., 'A'. In addition, because the Idle Cycle parameter is set to one, the Deserializer block 816 may remove a serial data element. In some embodiments, the Deserializer block 816 may utilize the ValidIn control signal 1008 to determine which serial data element to remove. For example, the Deserializer block 816 may remove the fifth serial data element 1034, thereby generating a parallel data element 1040 of 'ABCD' in the third frame 1005. The Deserializer block 816 may also set its ValidOut control output signal to True 1046 for the first four serial data elements 1030-1033, and to False 1048 for the fifth serial data element 1034 in the third frame 1005.

In some embodiments, the Serializer and Deserializer components may introduce and remove one or more Idle Cycles without the use of any control signals. For example, the Serializer component may introduce one or more Idle Cycles starting at a default location in the serial output data. For example, the one or more Idle Cycles may be introduced starting at the end of the serial output data, starting at the beginning of the serial output data, or starting at some other designated location in the serial output data. The Deserializer component may remove one or more Idle Cycles starting from a default location in the received serial input data. For example, the one or more Idle Cycles may be removed starting at the end of the serial output data, starting at the beginning of the serial output data, or starting at some other designated location in the serial output data. In addition, the Serializer component may arrange the data elements of the input parallel data in a default order in the serial output data. For example, the Serializer component may follow a left-to-right, top-to-bottom, or other ordering when converting input parallel data to output serial data. The Deserializer component may arrange the data elements of the input serial data in a default order in the parallel output data. It should be understood that the default configuration of the Deserializer component may match the default configuration of the Serializer component.

In some embodiments, the optimization engine 308 may utilize Idle Cycles when performing a streaming optimization to a source model to constrain overclocking.

Synchronous Operation—Control Signals

In some embodiments, the control signals of the Serializer and Deserializer components may be utilized to reduce state elements, thus requiring for example fewer hardware resources, while maintaining synchronous operation of the model and the generated code, and constraining overclocking.

FIG. 11 is a schematic illustration of a source model 1100 having an Inport 1102, a Gain block 1104, a Delay block 1106, and an Outport block 1108. The Delay block 1106 may add a single unit of delay, e.g., it may output its input following a delay of one sample time of the Delay block 1106. The elements 1102-1106 of the source model 1100 may process vector data where the vectors have seven data elements. HDL code generated for the source model 1100, e.g., by the code generator 300, may include seven multipliers for the Gain block 1104 and seven delays for the Delay block 1104 as these model blocks process parallel data having seven elements.

Suppose the optimization engine 308 performs a streaming optimization to the source model 1100 where the streaming factor is 12. FIG. 12 is a schematic illustration of a first optimized model 1200 corresponding to the source model 1100. The optimized model 1200 includes the Inport block 1102, a Serializer component 1202, a Gain block 1204, a Delay block 1206, a Deserializer component 1208, and the Outport block 1106. The Serializer component 1202 may convert the parallel input data, which has seven elements, into a serial output stream of data having twelve elements based on the streaming factor. Five of the data elements may be Idle Cycles introduced by the Serializer component 1202. The Deserializer component 1208 may convert a serial input stream having twelve elements to parallel output data having seven elements. The Deserializer component 1208 may discard the five Idle Cycles introduced by the Serializer component 1202. The Gain block 1204 and the Delay block 1206 of the optimized model 1200 may operate at a rate, for example a simulation or sample rate, that is twelve times faster than the rate of the Gain block 1104 and Delay block 1106 of the source model 1100. HDL code generated for the first optimized model 1200, e.g., by the code generator 300, may include a single multiplier for the Gain block 1204, and twelve delays for the Delay block 1206.

In some embodiments, the optimization engine 308 may utilize control signals of Serializer and Deserializer components to achieve the indicated streaming optimization. The optimization engine 308 may use the control signals instead of introducing and removing Idle Cycles, as illustrated in the first optimized model 1100.

Figure 13:
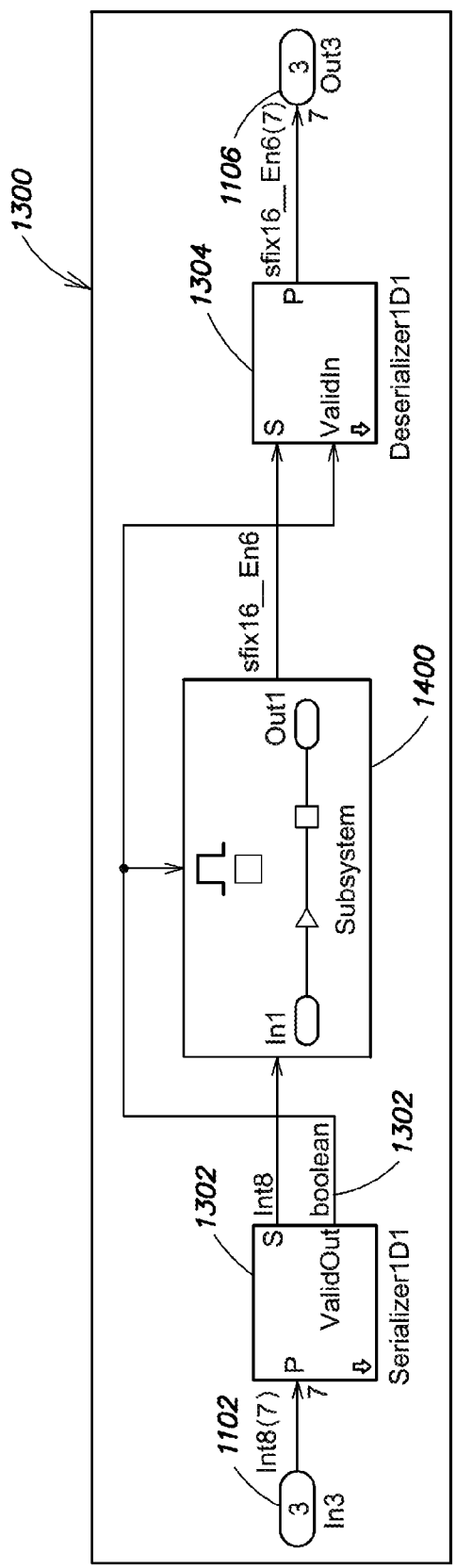
FIG. 13 is a schematic illustration of a second optimized model for the source model of FIG. 11 in accordance with an embodiment.

FIG. 13 is a schematic illustration of a second optimized model 1300 based on the source model 1100. The second optimized model 1300 includes the Inport block 1102, a Serializer component 1302, an enabled subsystem 1400, a Deserializer component 1304, and the Outport block 1106. The Serializer component 1302 may convert the 7-element parallel input data to a serial output stream of data having twelve elements. The Serializer component also generates a ValidOut control signal 1306 that controls the enabled subsystem 1400. For example, the enabled subsystem 1400 may execute at each simulation or time step for which its control signal is True or a positive value. The Deserializer component 1304 converts the serial input stream of data having twelve elements into parallel output data having seven elements. The Deserializer component 1304 may also receive the ValidOut signal 1306 generated by the Serializer component 1302.

Figure 14:
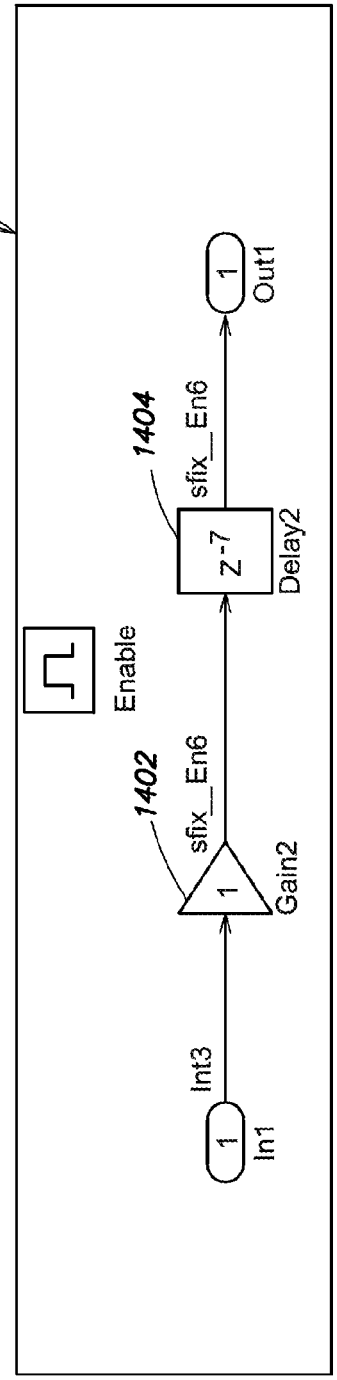
FIG. 14 is a schematic illustration of an enabled subsystem of the second optimized model of FIG. 13.

FIG. 14 is a schematic illustration of the enabled subsystem 1400 of the second optimized model 1300. The enabled subsystem 1400 includes a Gain block 1402 and a Delay block 1404. However, instead of having a delay block that provides a delay of twelve units, e.g., 12 sample times, as in the first optimized model 1200, the Delay block 1404 of the enabled subsystem 1400 of the second optimized model 1300 provides a delay of seven units, e.g., seven sample times. The enabled subsystem 1400 may operate at a rate that is twelve times faster than the rate at which the Gain and Delay blocks 1104 and 1106 of the source model 1100 operate.

During execution of the second optimized model 1300, the Serializer component 1302 may set its ValidOut control signal to True for the first seven data elements of the serial data output, and to False for the next five data elements. Accordingly, the enabled subsystem 1400 is enabled for the first seven data elements, but not the next five data elements. Additionally, the Deserializer component 1304 may receive the ValidOut control signal and may discard any data values associated with the last five elements received in each frame.

HDL code generated for the second optimized model 1300, e.g., by the code generator 300, may include a single multiplier for the Gain block 1402 and seven delays for the Delay block 1404. It should be understood that it may be more efficient to implement a delay of seven units, such as the Delay block 1404 of the second optimized model 1300, in hardware, than a delay of twelve units, such as the Delay block 1206 of the first optimized model 1200. For example, it may require fewer hardware elements, such as registers, thus resulting in less area and/or less power.

In some embodiments, the optimization engine 308 may utilize control signals of the Serializer and Deserializer components when performing a resource sharing optimization to a source model.

Flow Diagram

Figure 15A:
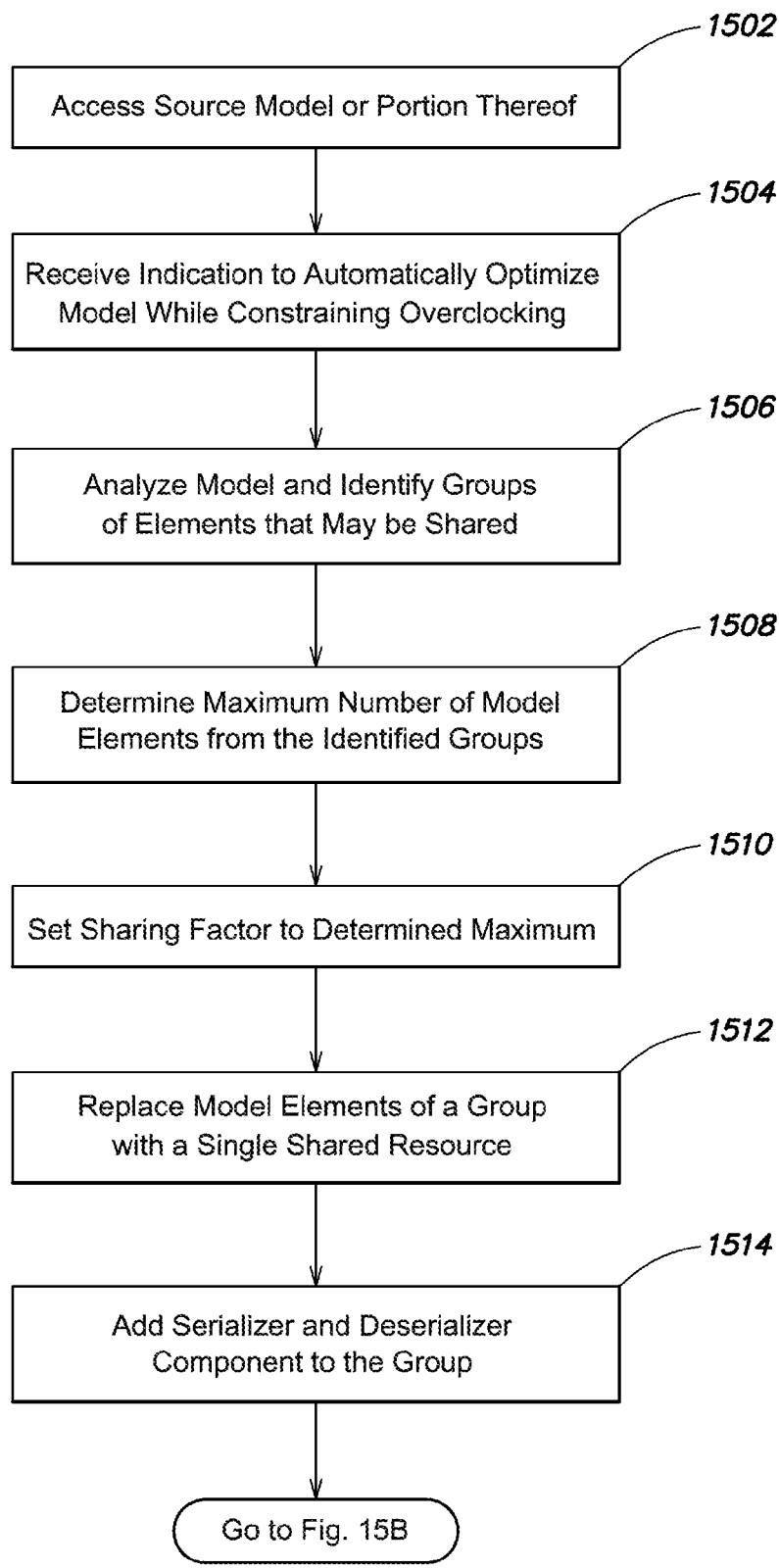
FIGS. 15A and 15B are flow diagrams of a method in accordance with an embodiment.
Figure 15B:
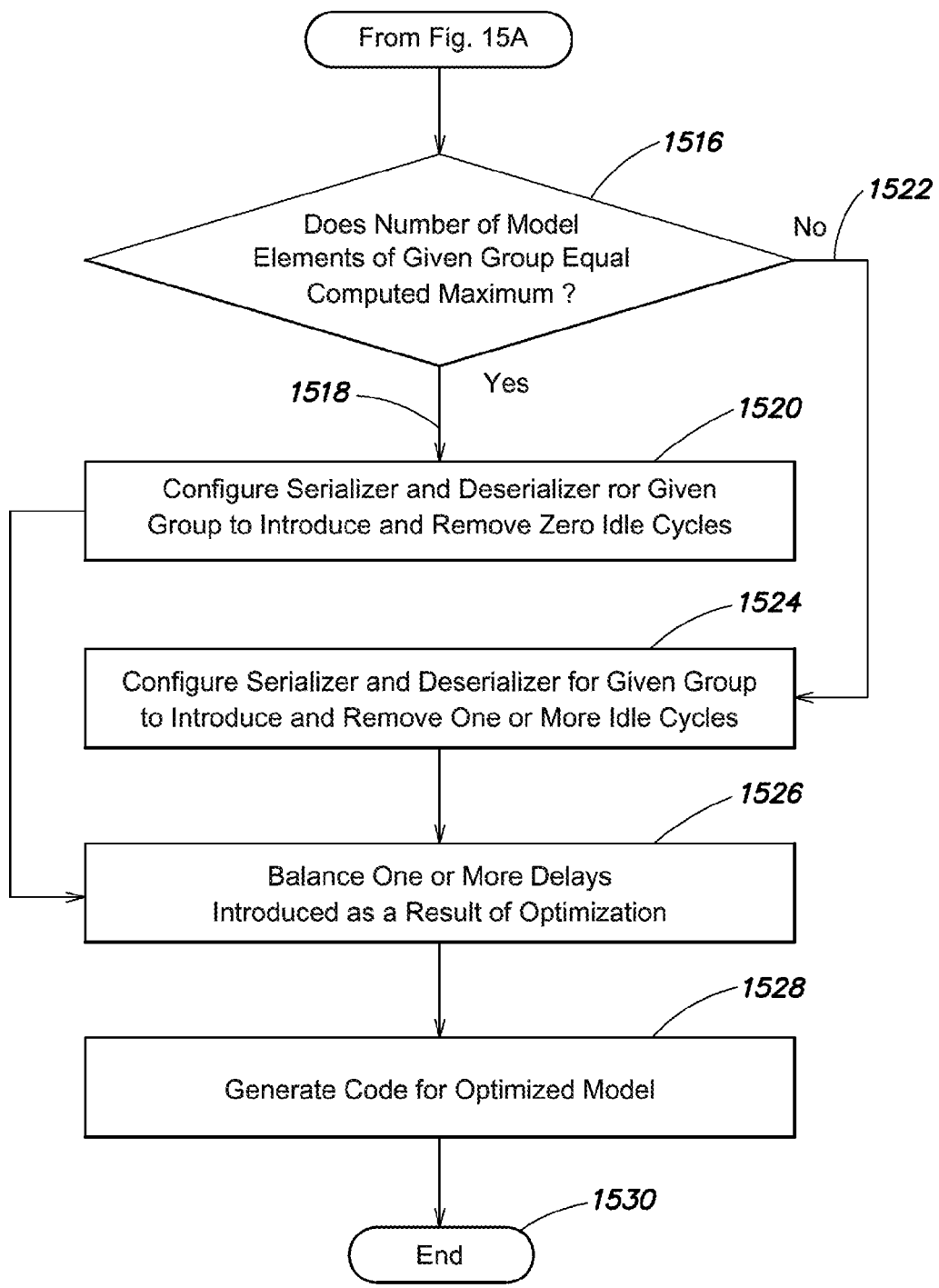

FIGS. 15A-B are partial views of a flow diagram of a method in accordance with an embodiment.

The code generator 300 may access a model or a portion thereof for which code, such as HDL code, is to be generated (step 1502). The model or portion thereof may be stored in a memory, such as the main memory of a work station or other data processing device. The optimization engine 308 may receive an indication to automatically maximize resource sharing while constraining the overclocking (step 1504). The optimization engine 308 may analyze the model to identify groups of model elements that may be shared (step 1506). The optimization engine 308 may determine the maximum number of model elements included in any one of the groups of model elements that are to be shared (step 1508). The optimization engine 308 may set the sharing factor for the model to this computed maximum value (step 1510).

For each group, the optimization engine 308 may replace the model elements of the group with a single shared element (step 1512). The optimization engine 308 may add a Serializer component and a Deserializer component to the model at each group of model elements being shared (step 1514). The optimization engine 308 may determine whether the number of original model elements of a given group equals the computed maximum value (step 1516) (FIG. 15B). For example, the optimization engine 308 may analyze each group, and count the number of original model elements in the group that are to be replaced with a single shared component. If the number of model elements of the given group equals the computed maximum, the optimization engine 308 may configure the Serializer and Deserializer components for the given group not to introduce (or remove) any Idle Cycles (Yes arrow 1518 leading to step 1520). If the number of model elements of the given group does not equal the computed maximum, the optimization engine 308 may configure the Serializer and Deserializer components for the given group to introduce (and remove) one or more Idle Cycles (No arrow 1522 leading to step 1524). The optimization engine 308 may subtract the number of model elements in the given group from the sharing factor to determine the number of Idle Cycles to be introduced by the respective Serializer component, and removed by the respective Deserializer component.

The delay balancing engine 316 may determine whether one or more delays have been introduced in the model as a result of the optimization, and may balance the one or more delays (step 1526). For example, the delay balancing engine 316 may evaluate an optimized version of a source model, and identify and account for, e.g., correct, latencies or delays that may have been introduced. The delay balancing engine 316 may traverse data and/or control paths of a model and sum the latencies or delays that have been introduced in the data and/or control paths. At locations in the model where two or more data and/or control paths merge, e.g., a join point, the delay balancing engine 316 may compare the sum of delays on each path, and determine whether the sums being compared are equal. If the sums are not equal at all of the merging paths, the delay balancing engine 316 may insert one or more Delay block into the path(s) whose sum is less than the other paths. The delay balancing engine also may configure the one or more inserted Delay blocks, for example with a delay value, so that the sum of delays of all of the merging paths is equal at the join point being evaluated. The one or more inserted Delay block also may be configured to operate at the same rate as the other signals at the join point being evaluated. This process may be repeated at other join points in the model to ensure that the data and/or control paths remain aligned as specified in the original source model.

Code, such as HDL code, may be generated for the model as optimized (step 1528), and processing may be completed (end step 1530).

The generated HDL code may be provided to a hardware synthesis toolchain, and one or more target hardware elements may be synthesized from the generated HDL code. The one or more synthesized hardware elements may be used to conduct verification or other testing, or deployed as a production system.

It should be understood that one or more of the steps may be performed on one or more in-memory representations, such as one or more Intermediate Representations (IRs), of the model or portion thereof, e.g., as generated by the IR generator 304.

It should be understood that additional or other steps may be performed. For example, the code generation report 328 may be generated by the report generator 310, the model generator 318 may create the validation model 330, which may be analyzed by the validation engine 332, etc.

For a streaming optimization, the optimization engine 308 may analyze a source model and find instances where a parallel data stream is to be converted to a serial data stream. The optimization engine 308 may determine MAX (the vector size of the input data signal over the scalar or smaller vector size of the output data signal for all such instances). The optimization engine 308 may utilize this MAX value as the streaming factor. For instances where the vector size of the input data signal over the scalar or smaller vector size of the output data signal is not the MAX value, the optimization engine 308 may not utilize the control signals, e.g., Valid signal, of the respective Serializer and Deserializer components. For instances where the vector size of the input data signal over the scalar or smaller vector size of the output data signal is less than the MAX value, the optimization engine 308 may utilize the Valid control signal of the respective Serializer component to control execution of the model elements whose parallel data stream is being serialized. For example, the model elements may be placed in an enabled subsystem of the source model, and the Valid control signal may be utilized to control execution of this enabled subsystem.

In some embodiments, the optimization engine 308 may automate a resource sharing optimization utilizing control signals and/or automate a streaming optimization utilizing Idle Cycles.

Exemplary Data Processing Device

Figure 16:
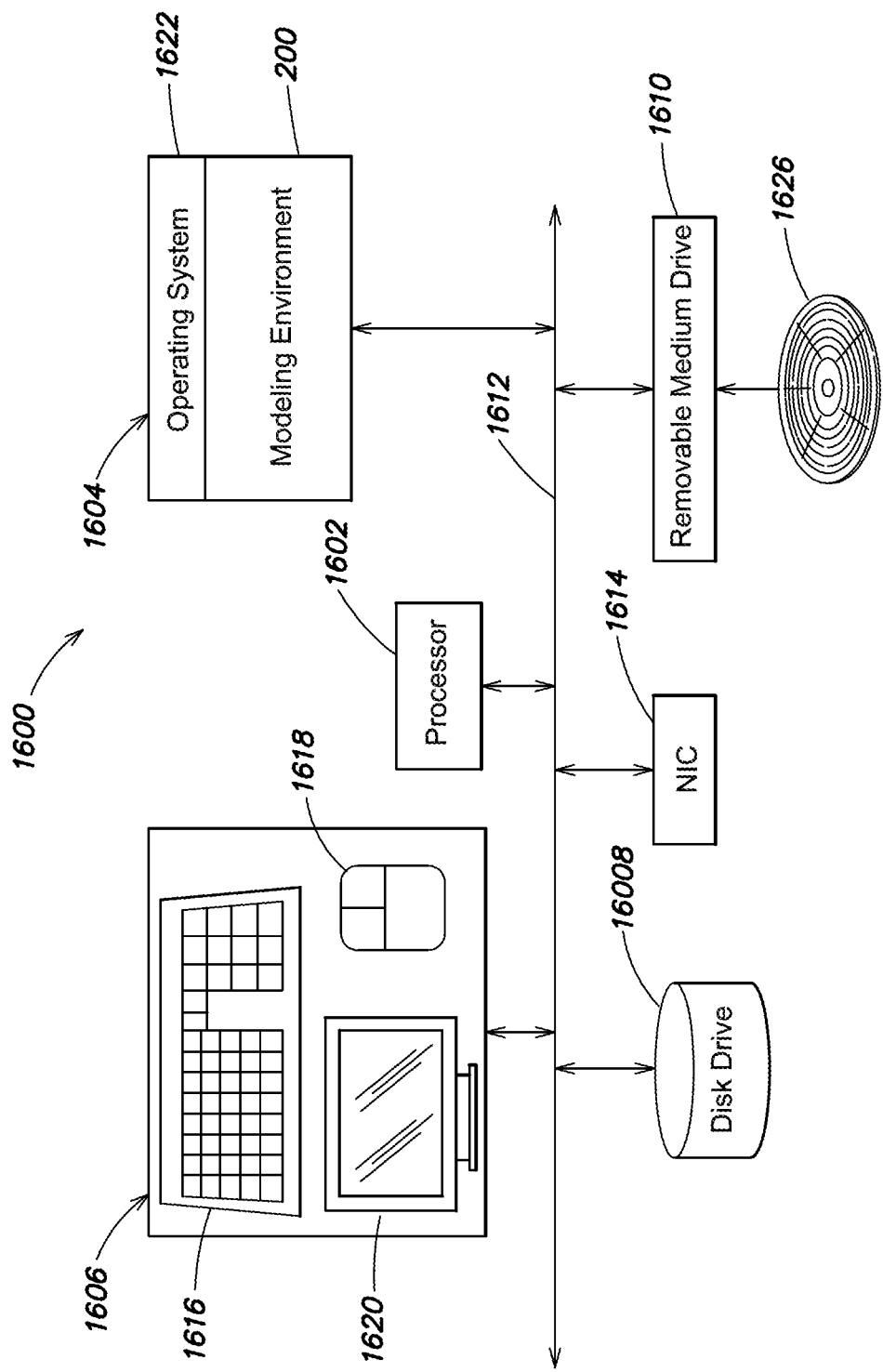
FIG. 16 a schematic illustration of a data processing system in accordance with an embodiment.

FIG. 16 is a schematic illustration of a computer or data processing system 1600 for implementing and utilizing an embodiment of the invention. The computer system 1600 includes one or more processing elements, such as a central processing unit (CPU) 1602, a main memory 1604, user input/output (I/O) 1606, a disk drive 1608, and a removable medium drive 1610 that are interconnected by a system bus 1612. The computer system 1600 may also include a network interface card (NIC) 1614. The user I/O 1606 may include a keyboard 1616, a mouse 1618 and a display 1620.

The main memory 1604 may store a plurality of libraries or modules, such as an operating system 1622, and one or more applications running on top of the operating system 1622, including the modeling environment 200. The main memory 1604 may also include a code generator 300. The code generator 300 may be a toolbox or an add-on product to the modeling environment 200. Furthermore, as described herein, the main memory 1604 may include a program specification, such as a source model 320, and a validation model 330.

The removable medium drive 1610 may accept and read a computer readable medium 1626, such as a CD, DVD, floppy disk, solid state drive, tape, flash memory or other medium. The removable medium drive 1610 may further write to the computer readable medium 1626.

Suitable computer systems include personal computers (PCs), workstations, laptops, tablets, palm computers and other portable computing devices, etc. Nonetheless, those skilled in the art will understand that the computer system 1600 of FIG. 16 is intended for illustrative purposes only and that the present invention may be used with other computer systems, data processing systems or computational devices. The present invention may also be used in a networked, e.g., client-server, computer architecture, or a public and/or private cloud computing arrangement.

Suitable operating systems 1622 include the Windows series of operating systems from Microsoft Corp. of Redmond, Wash., the Linux operating system, the MAC OS® series of operating systems from Apple Inc. of Cupertino, Calif., and the UNIX® series of operating system, among others.

As indicated above, a user or developer, such as an engineer, scientist, programmer, etc., may utilize the keyboard 1616, the mouse 1618 and the computer display 1620 of the user I/O 1606 to operate the modeling environment 200, and create the source model 320.

The foregoing description of embodiments is intended to provide illustration and description, but is not intended to be exhaustive or to limit the disclosure to the precise form disclosed. Modifications and variations are possible in light of the above teachings or may be acquired from a practice of the disclosure. For example, while a series of acts has been described above with respect to the flow diagrams, the order of the acts may be modified in other implementations. In addition, the acts, operations, and steps may be performed by additional or other modules or entities, which may be combined or separated to form other modules or entities. Further, non-dependent acts may be performed in parallel. Also, the term "user", as used herein, is intended to be broadly interpreted to include, for example, a computer or data processing system or a human user of a computer or data processing system, unless otherwise stated.

Further, certain embodiments of the disclosure may be implemented as logic that performs one or more functions. This logic may be hardware-based, software-based, or a combination of hardware-based and software-based. Some or all of the logic may be stored in one or more tangible non-transitory computer-readable storage media and may include computer-executable instructions that may be executed by a computer or data processing system, such as system 1200. The computer-executable instructions may include instructions that implement one or more embodiments of the disclosure. The tangible non-transitory computer-readable storage media may be volatile or non-volatile and may include, for example, flash memories, dynamic memories, removable disks, and non-removable disks.

No element, act, or instruction used herein should be construed as critical or essential to the disclosure unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

The foregoing description has been directed to specific embodiments of the present disclosure. It will be apparent, however, that other variations and modifications may be made to the described embodiments, with the attainment of some or all of their advantages. Therefore, it is the object of the appended claims to cover all such variations and modifications as come within the true spirit and scope of the disclosure.

What is claimed is:

1. A method for extending hardware optimizations for a model of a system created in a modeling environment, the method comprising:
    accessing, from a memory of a first computer, the model, the model having executable semantics;
    identifying, by one or more processors of the first computer or a second computer, a plurality of sets of model elements of the model where the model elements of the plurality of sets are functionally equivalent with each other;
    determining, by the one or more processors of the first computer or the second computer, a maximum number of model elements in the plurality of sets;
    replacing, by the one or more processors of the first computer or the second computer, the model elements of the plurality of sets of the model that are functionally equivalent with shared model elements;
    inserting into the model for the plurality of sets serializer components and deserializer components;
    if a first number of model elements for a first set is equal to the maximum number of model elements in the plurality of sets, configuring, by the one or more processors of the first computer or the second computer, a first shared model element for the first set to execute at an execution rate;
    if a second number of model elements for a second set is less than the maximum number of model elements in the plurality of sets, configuring, by the one or more processors of the first computer or the second computer:
        a second shared model element for the second set to execute at the execution rate, and
        a respective serializer component and a respective deserializer component for the second set to maintain a synchronous execution of the second shared model element within the model.

2. The method of claim 1 where the execution rate satisfies an overclocking constraint.

3. The method of claim 2 where the overclocking constraint is
    user specified, or
    determined programmatically.

4. The method of claim 1 where the configuring the respective serializer component and the respective deserializer component for the second set includes:
    configuring the respective serializer component to introduce one or more idle cycles, and
    configuring the respective deserializer to remove the one or more idle cycles.

5. The method of claim 4 wherein the one or more idle cycles equals the first number of model elements of the first set less the second number of model elements of the second set.

6. The method of claim 4 wherein the one or more idle cycles are null values.

7. The method of claim 1 further comprising:
    configuring the second shared model element for the second set to execute when a control signal is at a determined value, where the configuring the respective serializer component and the respective deserializer component for the second set includes configuring the respective serializer component to generate the control signal.

8. The method of claim 7 wherein the respective serializer component for the second set
converts a parallel input data into a serial data input stream, and
sets the control signal as valid for a sequence of data elements of the serial data input stream equal to the second number of model elements in the second set.

9. The method of claim 8 wherein the configuring the respective serializer component and the respective deserializer component for the second set further includes
configuring the deserializer component to
receive the control signal, and
discard one or more of the data elements when the control signal is at the determined value.

10. The method of claim 1 further comprising:
generating a hardware description of the model.

11. The method of claim 10 wherein the hardware description is hardware description language (HDL) code that corresponds to at least one of VHDL code, Verilog code, and SystemC code.

12. A method for extending hardware optimizations for a model of a system created in a modeling environment, the method comprising:
accessing, from a memory of a first computer, the model, the model having executable semantics;
identifying, by one or more processors of the first computer or a second computer, a plurality of sets of model elements of the model where the model elements of the plurality of sets are functionally equivalent with each other;
determining, by the one or more processors of the first computer or the second computer, a maximum number of model elements in the plurality of sets;
replacing, by the one or more processors of the first computer or the second computer, the model elements of the plurality of sets that are functionally equivalent with shared model elements;
inserting into the model for the plurality of sets serializer components and deserializer components;
if a number of model elements for a set of the plurality of sets, is less than the maximum number, configuring, by the one or more processors of the first computer or the second computer
a respective serializer component to introduce one or more idle cycles, and
a respective deserializer component to remove the one or more idle cycles; and
configuring, by the one or more processors of the first computer or the second computer, the serializer components and the deserializer components to operate at a given overclocking rate.

13. The method of claim 12 wherein the given overclocking rate satisfies a constraint.

14. The method of claim 13 wherein the constraint is
user specified, or
determined programmatically.

15. A method, for extending hardware optimizations for a model of a system created in a modeling environment, the method comprising:
accessing, from a memory of a first computer, the model, the model having executable semantics, the model having a plurality of target model elements that receive parallel input data having a dimension, and
perform a function on the parallel input data;
determining, by one or more processors of the first computer or a second computer, a maximum dimension of the parallel input data received by the plurality of target model elements;
inserting into the model for the plurality of target model elements a serializer component and a deserializer component;
if the parallel input data for a first target model element is equal to the maximum dimension, configuring the first target model element to execute at an execution rate;
if the parallel input data for a second target model element is less than the maximum dimension, configuring the second target model element to execute at the execution rate; and
configuring a respective serializer component and a respective deserializer component for the second target model element to maintain a synchronous execution of a shared model element within the model.

16. The method of claim 15 where the configuring the respective serializer component and the respective deserializer component for the second target model element includes:
configuring the respective serializer component to introduce one or more idle cycles, and
configuring the respective deserializer to remove the one or more idle cycles.

17. The method of claim 16 wherein the one or more idle cycles equals a difference between the maximum dimension and a dimension of the parallel input data of the second target model element.

18. The method of claim 15 further comprising:
configuring the second target model element to execute when a control signal is at a determined value, where the configuring the respective serializer component and the respective deserializer component for the second target model element includes configuring the respective serializer component to generate the control signal.

19. The method of claim 18 wherein the respective serializer component for the second target model element
converts the parallel input data into a serial data input stream, and
sets the control signal as valid for a sequence of data elements of the serial input data stream equal to the dimension of the parallel input data to the second target model element.

20. A method for extending hardware optimizations for a model of a system created in a modeling environment, the method comprising:
accessing, from a memory of a first computer, the model, the model having executable semantics;
identifying, by one or more processors of the first computer or a second computer, a first set of model elements of the model that are functionally equivalent with each other;
replacing, by the one or more processors of the first computer or the second computer, the first set of model elements that are functionally equivalent with a first single shared model element;
inserting a first serializer component into the model, the first serializer component converting first parallel data of a first data path to first serial data at a first rate;
inserting a first deserializer component into the model, the first deserializer component converting the first serial data of the first data path back to the first parallel data;

connecting the first serializer component and the first deserializer component to the first single shared model element;

identifying a second set of model elements of the model that are functionally equivalent with each other, where the second set contains fewer elements than the first set;

replacing the second set of model elements that are functionally equivalent with a second single shared model element;

inserting a second serializer component into the model, the second serializer component converting second parallel data of a second data path to second serial data at a second rate;

inserting a second deserializer component into the model, the second deserializer component converting the second serial data of the second data path back to the second parallel data;

connecting the second serializer component and the second deserializer component to the second single shared model element;

configuring the second serializer component to introduce one or more idle cycles into the second data path; and configuring the second deserializer component to remove the one or more idle cycles introduced into the second data path, where the second rate is equal to or less than the first rate.

21. The method of claim 20 further comprising:

configuring the first serializer component to generate a first control signal that designates elements of the first parallel data converted by the first serializer component as either valid or invalid; and configuring the first serializer component to generate a second control signal that designates a first element of the first serial data as a start of a frame of the first parallel data.

22. The method of claim 20 further comprising:

configuring the first deserializer component to receive a first control signal that designates elements of the first serial data as either valid or invalid; and configuring the first deserializer component to receive a second control signal that designates a first element of the first serial data as a start of a frame of the first parallel data.

23. The method of claim 20 wherein the model executes synchronously, and the one or more idle cycles maintain the synchronous execution of the model.

24. The method of claim 20 wherein the one or more idle cycles constrain an overclocking of the model to the first rate.

25. An apparatus for extending hardware optimizations for a model of a system created in a modeling environment, the apparatus comprising:

a memory configured to store the model, the model having executable semantics; and one or more processors configured to:

identify a plurality of sets of model elements of the model where the model elements of the plurality of sets are functionally equivalent with each other;

determine a maximum number of model elements in the plurality of sets;

replace the model elements of the plurality of sets that are functionally equivalent with shared model elements;

insert into the model for the plurality of sets serializer components and deserializer components;

utilize a respective serializer component to introduce one or more idle cycles and a respective deserializer component to remove the one or more idle cycles if a number of model elements, for a set of the plurality of sets, is less than the maximum number; and configure the serializer components and the deserializer components to operate at a given overclocking rate.

26. The apparatus of claim 25 wherein the given overclocking rate satisfies a constraint.

27. The apparatus of claim 26 wherein the constraint is user specified, or
determined programmatically.

28. One or more non-transitory computer-readable media storing executable instructions for execution by processing logic hardware, the media storing one or more instructions for:

accessing, from a memory, a model of a system created in a modeling environment, the model having executable semantics;

identifying a plurality of sets of model elements of the model where the model elements of the plurality of sets are functionally equivalent with each other;

determining, by the processing logic hardware, a maximum number of model elements in the plurality of sets;

replacing, by the processing logic hardware, the model elements of the plurality of sets that are functionally equivalent with shared model elements;

inserting into the model for the plurality of sets serializer components and deserializer components;

configuring a respective serializer component to introduce one or more idle cycles and a respective deserializer component to remove the one or more idle cycles if a number of model elements, for a set of the plurality of sets, is less than the maximum number; and configuring the serializer components and the deserializer components to operate at a given overclocking rate.

29. The non-transitory computer-readable media of claim 28 wherein the given overclocking rate satisfies a constraint.

30. The non-transitory computer-readable media of claim 29 wherein the constraint is
user specified, or
determined programmatically.

* * * * *